United States Patent [19]

Theus

[11] Patent Number: 5,182,525

[45] Date of Patent: Jan. 26, 1993

[54] CMOS TRANSCONDUCTANCE AMPLIFIER WITH FLOATING OPERATING POINT

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 805,731

[22] Filed: Dec. 9, 1991

[30] Foreign Application Priority Data

Dec. 22, 1990 [EP] European Pat. Off. ......... 90125348.4

[51] Int. Cl.$^5$ ............................................. H03F 3/45
[52] U.S. Cl. ..................................... 330/253; 330/257
[58] Field of Search ............... 330/253, 257, 260, 261, 330/277, 288, 296

[56] References Cited

U.S. PATENT DOCUMENTS

| | | | |
|---|---|---|---|
| 4,355,341 | 10/1982 | Kaplan | 330/253 |
| 4,480,230 | 10/1984 | Brehmer et al. | 330/255 |
| 4,803,441 | 2/1989 | Noro | 330/257 |
| 4,859,963 | 8/1989 | Schaffer | 330/253 |
| 4,897,612 | 1/1990 | Carroll | 330/253 |
| 5,068,622 | 11/1991 | Mead et al. | 330/253 |
| 5,113,148 | 5/1992 | Theus | 330/253 |

OTHER PUBLICATIONS

Joseph N. Babanezhad et al., "A Programmable Gain/Loss Circuit," *IEEE Journal of Solid-State Circuits*, vol. SC-22, No. 6, Dec. 1987, pp. 1082–1089.

Ludwig G. A. Callewaert et al., "Class AB CMOS Amplifiers with High Efficiency," *IEEE Journal of Solid-State Circuits*, vol. 25, No. 3, Jun. 1990, pp. 684–691.

Y. Isividis et al., "Design of MOS VLSI Circuits for Telecommunications," Prentice-Hall, Inc., New Jersey, 1985, ISBN 0-13-200643-X, pp. 129–136.

U. Tietze et al., "Halbleiter-Schaltungstechnik," Springer-Verlag, Berlin, Germany, 1980, pp. 352–354, 372–375 ( in German, no translation).

*Primary Examiner*—Steven Mottola
*Attorney, Agent, or Firm*—Thomas L. Peterson

[57] ABSTRACT

A CMOS transconductance amplifier with a floating operating point which has low quiescent-current consumption for a voltage-to-current converter. On the other hand, the current yield of the output transistor in an output current mirror for a load current is high. The low quiescent-current consumption is achieved by connecting a coupling transistor used as a low-impedance diode in parallel with an active load in the current output stage of the voltage-to-current converter. The high current yield is achieved by means of a positive-feedback circuit which adds to the quiescent current of the voltage-to-current converter an auxiliary current proportional to the load current, thus forming a floating operating point.

14 Claims, 1 Drawing Sheet

CMOS TRANSCONDUCTANCE AMPLIFIER WITH FLOATING OPERATING POINT

BACKGROUND OF THE INVENTION

1. Field of the Invention

The present invention relates to a CMOS transconductance amplifier comprising a voltage-to-current converter having a differential input for an input voltage, and further comprising an output current mirror having its control input coupled to the current output of the voltage-to-current converter, with the high-impedance current output of the output current mirror connected to an output node from which the output current of the transconductance amplifier, load current, is obtainable.

2. Description of the Related Art

High-transconductance amplifiers are also referred to as "operational transconductance amplifiers." They are used as amplifying elements for switched-capacitor filters and should have as high a gain as possible. By the high transconductance, the respective charge condition of these capacitors is to be brought to a new charge condition as quickly as possible. The stability of this recharging process is ensured by the load capacitance itself.

One disadvantage of CMOS monolithic integrated transconductance amplifiers is the relatively low transconductance of the MOS transistors. Another disadvantage results if MOS transistors are used in such amplifiers as source followers because these source followers have a relatively high internal resistance. Furthermore, with the wide variation in load current, which results from the capacitor recharging, the square-law current-voltage characteristic enters into the recharging process during large-signal operation, which produces distortion with an even harmonic component.

SUMMARY OF THE INVENTION

The invention described and claimed herein provides a CMOS transconductance amplifier having a floating operating point which, despite low quiescent current consumption, combines high current yield and maximum transconductance.

The present invention further provides a CMOS monolithic integrated transconductance amplifier which forms part of a monolithic integrated voltage regulator circuit for feeding a CMOS circuit. The chip area is occupied essentially by the CMOS circuit, which preferably consists of digitally operating cells that can be taken from a cell library during circuit design.

The invention further includes a voltage regulator circuit on the chip in such a way that it requires no additional external filter means. This reduces the number of external terminals.

BRIEF DESCRIPTION OF THE DRAWINGS

The invention and further advantages thereof will now be explained in more detail with reference to the accompanying drawing, in which.

DETAILED DESCRIPTION OF THE PREFERRED EMBODIMENT

Figure 1:
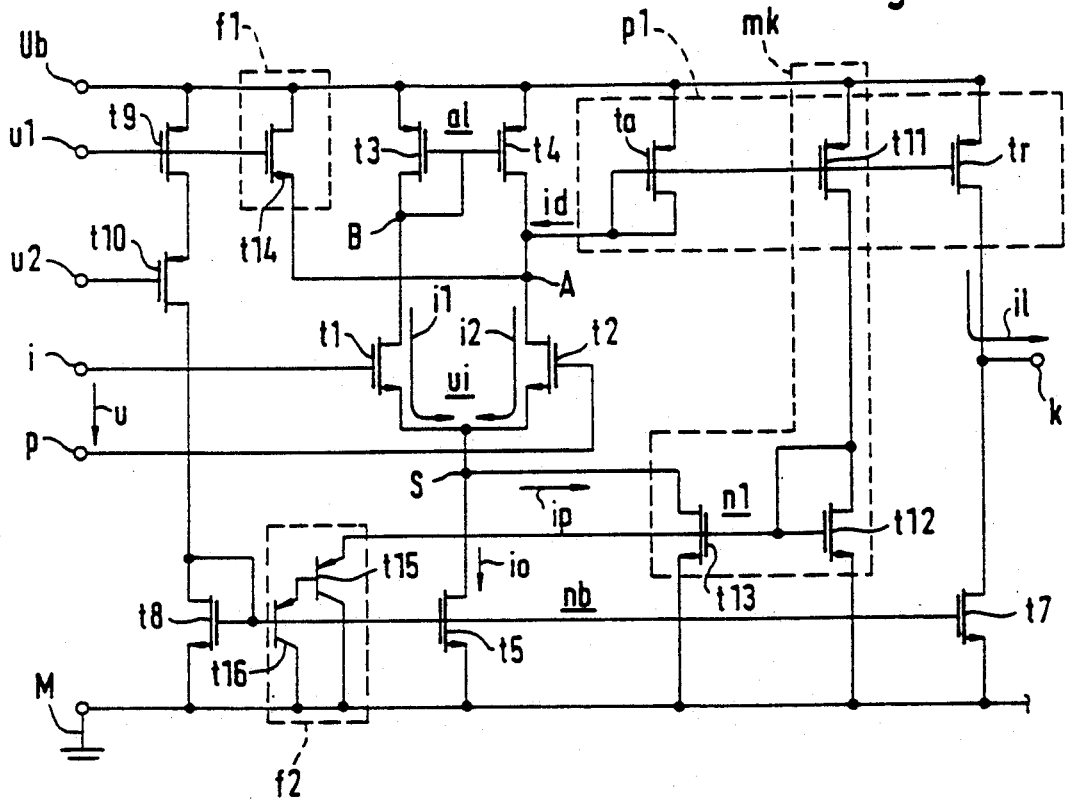
FIG. 1 is a schematic circuit diagram of an embodiment of the CMOS transconductance amplifier.

The input stage of the CMOS transconductance amplifier tc shown in FIG. 1 includes a voltage-to-current converter ui consisting of first and second transistor t1, t2 of the n-channel type. The gate terminals of the first and second transistors t1 and t2 are connected to the inverting and non-inverting inputs i and p, respectively, to whose terminals an input voltage u is applied as a voltage difference. The interconnected source terminals of the first and second transistors t1, t2 form a current feed point s which is supplied with a quiescent current io form an n-channel current bank nb.

The drain terminals of the second and first transistors t2, t1 are connected to a first junction point A and a second junction point B, respectively. The voltage-to-current converter ui divides the current supplied to the current feed point S into a first Current i1 and a second current i2. The second current i2 is obtainable from the first junction point A, and the first current i1 is obtainable from the second junction point B, the weighting ratio being dependent on the input voltage u.

Connected between the first junction point A and the second junction point B are the output and input of an active load al consisting of two p-channel transistors, namely the third and fourth transistors t3, t4, which form a p-channel current mirror.

The combination of the output currents of the second transistor t2 and the active load al at the first junction point A results in the formation of a difference between the first and second currents i1, i2. The first junction point A forms the current output of the voltage-to-current converter ui for the differential current id.

The differential current id is coupled out by means of a low-impedance output current mirror p1 made up of p-channel transistors. A coupling transistor ta has its common gate-drain terminal connected to the first junction point A, thereby defining the level of the common gate interconnection line of the output current mirror p1. The low end of this current mirror p1 is connected to a positive supply voltage Ub. The output current mirror p1 contains an output transistor tr, a further transistor t11, which forms the input of a positive feedback circuit mk, and the coupling transistor ta.

The quiescent current io supplied to the current feed point s is formed in the n-channel current bank nb by means of a fifth transistor t5 of the n-channel type whose ate is connected to the gate interconnection line of the n-channel current bank nb.

The output stage of the CMOS transconductance amplifier of FIG. 1 contains a complementary transistor pair tr, t7 whose source-drain paths are connected in series, with the common drain terminal forming an output node k from which the load current il is obtainable. However, only very little driving power is applied through the n-channel current bank nb to the second output transistor t7, so that the constant drain-source current of the latter is approximately equal to the low quiescent current io of the voltage-to-current converter ui. In addition, the width-to-length (W/L) ratio of the second output transistor t7 is less than that of the first output transistor tr by a factor of about 1000, so that its effect on the load current il in the presence of large currents is negligible.

The transconductance of the CMOS transconductance amplifier is adjustable via the W/L ratios of the first and second transistors t1, t2, the output transistor tr, and the coupling transistor ta and via the quiescent current io. However, there is an upper limit to this adjustment of transconductance. In particular, the junction point A may be only lightly capacitively loaded because otherwise the circuit would become unstable. A large W/L ratio in the output transistor tr places a capacitive load on the junction point A through the enlarged gate area.

Since only one load-current direction is needed for the intended use of the CMOS transconductance amplifier in an on-chip voltage regulator, the second output transistor t7 need not have a high current yield. This transistor is only designed to prevent a floating condition of the output potential under no-load conditions. It is sufficient to connect the small second output transistor t7 to the gate interconnection line of the n-channel current bank nb, so that a small constant current proportional or equal to the quiescent current io flows through its drain-source path. The potential of the common gate interconnection line is controlled by an n-channel control transistor ts whose common gate-drain terminal is fed with the positive supply voltage Ub through a cascode current source comprising first and second transistors t9 and t10. The gate terminals of the first and second transistors t9 and t10 of the cascode current source are connected to a first bias input u1 and a second bias input u2, respectively. The positive supply voltage Ub also forms the low end of the active load al and the output current mirror p1.

Since the W/L ratio of the output transistor tr cannot be made arbitrarily large compared to that of the coupling transistor ta because of the capacitive loading, according to the invention, a different approach is taken by means of a positive-feedback circuit mk to further increase the transconductance of the CMOS transconductance amplifier. The positive-feedback circuit mk generates an auxiliary current ip which is proportional to the load current and is added to the constant quiescent current io, thereby causing a floating operating point of the control current in the voltage-to-current converter ui. It only contains the first positive-feedback transistor t11 of the p-channel type and a second and a third positive-feedback transistor t12, t13 of the n-channel type. The second and third positive-feedback transistors t12 and t13 are connected together to form an n-channel current mirror n1. The first positive-feedback transistor t11 forms part of the output current mirror p1 and has its drain terminal connected to the input of the n-channel current mirror n1. The output of the latter is formed by the drain terminal of the third positive-feedback transistor t13 and is connected to the current feed point S. The drain terminal of the third positive-feedback transistor represents a high-impedance current sink for the auxiliary current ip. The low end of the n-channel current mirror n1 is the negative supply voltage, which is usually also the ground connection M.

The essential advantage of the transconductance amplifier in accordance with the invention lies in the fact that despite the high overall transconductance, the quiescent current of the output transistor tr is negligible, particularly when no load current il is flowing. This reduces total power consumption and, thus, facilitates better operation. This is achieved by the parallel combination of the active load al and the low-impedance diode path of the coupling transistor ta as follows. At an input voltage u of 0 volts, the two currents i1, i2 are equal. Consequently, the output current of the active load al at the fourth transistor t4 is equal to the drain current of the second transistor t2, so that the current difference at the first junction point A becomes zero. Thus, no current is left to drive the output current mirror p1, so that the output transistor tr carries no current except the small constant current of the second output transistor t7. This ensures low power consumption of the CMOS transconductance amplifier in the presence of a low or negligible load current il.

The current yield of the output transistor tr covers, for example, a range from 2 microamperes in the quiescent condition to 5 milliamperes in the power-on condition. The total power consumption of the CMOS transconductance amplifier in the quiescent condition is approximately 5 microamperes—this is the power consumption of the n-channel current bank nb.

To limit the maximum load current il to about 30 milliamperes in the event of a brief short circuit in the power-on condition, a current-limiting facility is provided which consists of a first and a second current limiter f1, f2. In the first current limiter f1, an n-channel transistor t14 connected as a source follower prevents the current at the first junction point A from falling below a predetermined value. The gate and drain terminals of this transistor t14 are connected to the first bias u1 and the positive supply voltage Ub, respectively. The second current limiter f2 is a Darlington pair consisting of two substrate-pnp transistors t15, t16, with the emitter of the transistor t15 connected to the common gate terminal of the n-channel current mirror n1. The base terminal of the transistor t16 is connected to the common gate interconnection line of the n-channel current bank nb. The current limiting in the circuit shown in FIG. 1 requires only very little additional circuitry. The steps to be taken to provide more effective current limiting, which may require more complicated circuitry, are well known to those skilled in the art.

Figure 2:
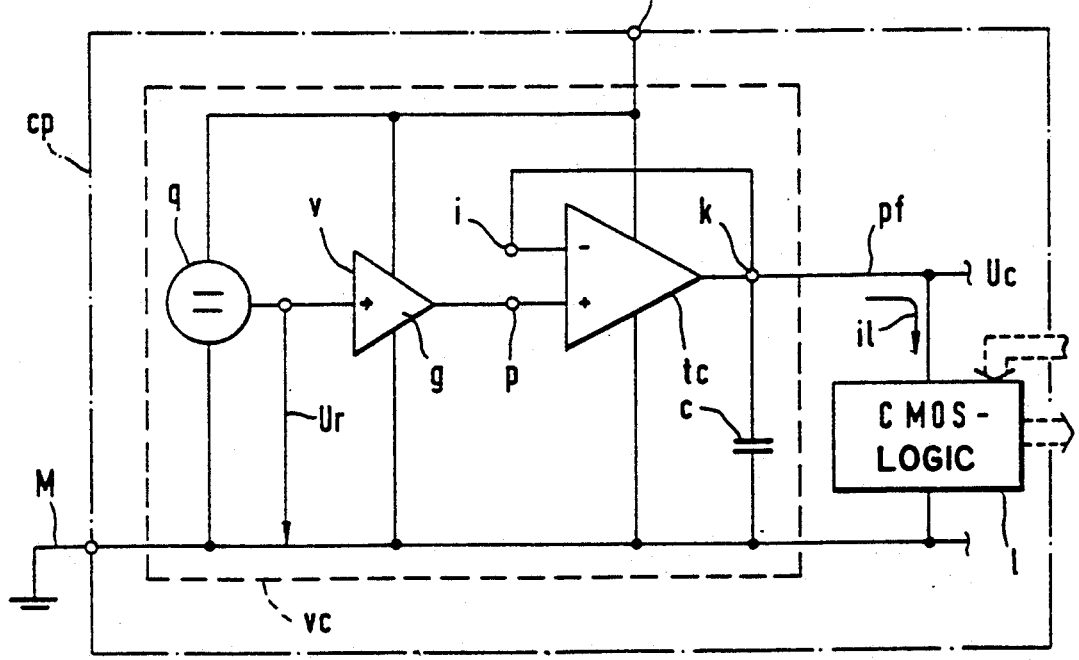
FIG. 2 is a block diagram of an on-chip voltage regulator for a CMOS logic circuit.

If the CMOS transconductance amplifier is used in a circuit arrangement as shown in FIG. 2, it may be necessary for part of the transistors to have a higher drain-source breakdown voltage than conventional CMOS transistors. That will be the case if the positive supply voltage Ub is a voltage greater than the usual CMOS supply voltage, which is typically around 5 volts. If the CMOS transconductance amplifier is used in an automobile, for example, the on-board voltage may rise above 24 volts. This voltage must then be safely sustainable by most of the transistors of the CMOS transconductance amplifier, particularly the transistors t1, t2, t10, t11 and tr in FIG. 1. On safety and symmetry grounds, further transistors, such as the coupling transistor ta and the second output transistor t7, may be designed to sustain such a high voltage. The individual circuit blocks of the logic signal-processing circuitry in the CMOS circuit 1 may be extracted from a conventional cell library, the design of the individual cells being optimized for a given circuit technology and a specified supply voltage which is approximately equal to the regulated supply voltage Uc.

The circuit diagram of FIG. 1 shows a circuit in n-well technology, whose well terminal is connected to the positive supply voltage Ub. A realization using p-well technology is an obvious equivalent.

FIG. 2 shows schematically the use of the above-described CMOS transconductance amplifier in an on-chip voltage regulator. The transconductance amplifier to serves as a series regulator within a voltage regulator vc which is integrated together with the CMOS logic circuit 1 on a semiconductor chip cp. The voltage regulator vc includes a voltage-reference source q which generates a reference voltage Ur of, for example, 2.5 volts. Since this voltage reference is not loadable, it is followed by an electrometer amplifier v of gain g. With a gain of g equal 2, the output of the electrometer amplifier v provides a voltage of about 5 volts, which is applied to the non-inverting input p of the transconductance amplifier. The output node k of the latter is connected to the inverting input i, so that the voltage of the output node k is equal to the output voltage of the electrometer amplifier v. The transconductance amplifier tc operates as an impedance transformer. The output node k, which provides the regulated supply voltage Uc of 5 volts, is connected to the positive supply line pf of the CMOS circuit 1. The voltage-reference source q and the electrometer amplifier v are fed directly with the positive supply voltage Ub, since this voltage, although unregulated, is relatively stable.

The transient current spikes caused by switching the individual gates in the CMOS circuit 1 between the positive supply line pf and the ground connection M are blocked by an on-chip capacitor c having a capacitance of, for example, 1 nanofarad. Fast recharging of the capacitor c is aided by the high cutoff frequency of the transconductance amplifier, which is about 1 megahertz. In this connection, it is advantageous that, unlike the operational amplifier, the transconductance amplifier tc, in spite of having full negative feedback, requires no internal frequency compensation, which would make it slow. Its stability is achieved by the connection of the integrated capacitor c to the output node k, the capacitor c also serving to buffer the transient current spikes. This dual effect of the integrated capacitor c eliminates the need for external filter means and the associated external terminals of the circuit of FIG. 2. This additional advantage is particularly important in consumer and automotive applications.

What is claimed is:

1. A CMOS transconductance amplifier that receives a differential input voltage and generates an output current at an output node, comprising:
    a voltage-to-current converter having a differential input for receiving said differential input voltage, and having a current output stage comprising an active load, said active load forming a differential current from first and second currents which have a weighting ratio that depends on said input voltage, said differential current being provided at a first junction point, said voltage-to-current converter further including a current feed point; and
    an output current mirror having a low-impedance control input coupled to receive said differential current output from said voltage-to-current converter, and having a high-impedance current output formed by the high-impedance current output of an output transistor, said high-impedance current output being connected to said output node to provide a load current;
    wherein said transconductance amplifier further includes:
    a source that provides a constant quiescent current; and
    a positive-feedback circuit having an output that generates an auxiliary current proportional to said load current, said auxiliary current being supplied together with said constant quiescent current to said current feed point of said voltage-to-current converter.

2. A CMOS transconductance amplifier that receives a differential input voltage and generates an output current at an output node, comprising:
    a voltage-to-current converter having a differential input for receiving said differential input voltage, and having a current output stage comprising an active load, said active load forming a differential current from first and second currents which have a weighting ratio that depends on said input voltage, said differential current being provided at a first junction point, said voltage-to-current converter further including a current feed point;
    an output current mirror having a low-impedance control input coupled to receive said differential current output from said voltage-to-current converter, sand having a high-impedance current output formed by the high-impedance current output of an output transistor, said high-impedance current output being connected to said output node to provide a load current;
    a source that provides a constant quiescent current; and
    a positive-feedback circuit having an output that generates an auxiliary current proportional to said load current, said auxiliary current being supplied together with said constant quiescent current to said current feed point of said voltage-to-current converter;
    wherein:
    said positive-feedback circuit has an input, said input being part of said output current mirror;
    said output current mirror includes a coupling transistor having a common gate-drain terminal, said common gate-drain terminal being said input of said output current mirror, said output current mirror having a second output; and
    said output of the positive-feedback circuit is formed by a current mirror having an output coupled to said current feed point and having an input fed from said second output of the output current mirror.

3. A transconductance amplifier as defined in claim 2, wherein:
    said voltage-to-current converter includes first and second n-channel transistors and third and fourth p-channel transistors, said first and second transistors operating in a differential mode, said first and second transistors having a common source terminal that forms said current feed point;
    said first transistor has a drain terminal connected to a common gate-drain terminal of said third transistor and to a gate terminal of said fourth transistor, the fourth transistor having a drain transistor to form said first junction point, with said third and fourth transistors forming the active load; and
    said output current mirror is a p-channel current mirror comprising said coupling transistor, said output transistor and a first positive-feedback transistor, said positive-feedback transistor forming the input to said positive-feedback circuit, said output current mirror having a low end connected to a source of positive supply voltage, said output current mirror having a common gate interconnection line connected to said common gate-drain terminal of said coupling transistor.

4. A transconductance amplifier as defined in claim 3, wherein:
said positive-feedback circuit comprises an n-channel current mirror having an input and an output, said n-channel current mirror comprising second and third positive feedback n-channel transistors;
said first positive-feedback transistor has a drain terminal that feeds said input of said n-channel current mirror; and
said drain terminal of said third positive-feedback transistor is connected to said current feed point.

5. A transconductance amplifier as defined in claim 3, wherein at least the first and second transistors of said voltage-to-current converter, the output transistor in said output current mirror, and said first positive-feedback transistor are dimensioned so that their source-drain breakdown voltages are not exceeded by operation at an unregulated supply voltage.

6. A CMOS transconductance amplifier that receives a differential input voltage and generates an output current at an output node, comprising:
a voltage-to-current converter having a differential input for receiving said differential input voltage, and having a current output stage comprising an active load, said active load forming a differential current from first and second currents which have a weighting ratio that depends on said input voltage, said differential current being provided at a first junction point, said voltage-to-current converter further including a current feed point;
an output current mirror having a low-impedance control input coupled to receive said differential current output from said voltage-to-current converter, and having a high-impedance current output formed by the high-impedance current output of an output transistor, said high-impedance current output being connected to said output node to provide a load current;
a source that provides a constant quiescent current;
a positive-feedback circuit having an output that generates an auxiliary current proportional to said load current, said auxiliary current being supplied together with said constant quiescent current to said current feed point of said voltage-to-current converter; and
a current-limiting circuit that limits the load current to a maximum value.

7. A CMOS monolithic integrated circuit, comprising:
a signal-processing CMOS circuit and a voltage regulator integrated on a single semiconductor chip,
wherein said voltage regulator is a series regulator that generates a regulated supply voltage from an unregulated supply voltage without requiring any external filter components, said voltage regulator comprising:
a voltage-reference source that generates an output;
an electrometer amplifier having an input that receives the output of said voltage-reference source and having an output;
a transconductance amplifier having a floating operating point, said transconductance amplifier having an output node, said transconductance amplifier further having a noninverting input connected to receive said output of said electrometer amplifier and having an inverting input connected to said output node; and
an integrated capacitor having first and second terminals connected to said output node and a fixed reference potential, respectively, and serving both to stabilize the transconductance amplifier and to buffer the switching transient current spikes of said signal-processing CMOS circuit.

8. A CMOS monolithic integrated circuit as defined in claim 7, wherein:
said signal-processing CMOS circuit comprises a digital circuit constructed from a plurality of logic cells; and
the design of individual logic cells in said signal-processing CMOS circuit is optimized for a specified circuit technology and a specified supply voltage which is approximately equal to said regulated supply voltage.

9. A CMOS monolithic integrated circuit as defined in claim 7, wherein:
said transconductance amplifier is a CMOS transconductance amplifier that receives a differential input voltage between said inverting and non-inverting input terminals and that generates an output current at said output node, said CMOS transconductance amplifier comprising:
a voltage-to-current converter having a differential input for receiving said differential input voltage, and having a current output stage comprising an active load, said active load forming a differential current from first and second currents which have a weighting ratio that depends on said input voltage, said differential current being provided at a first junction point, said voltage-to-current converter further including a current feed point; and
an output current mirror having a low-impedance control input coupled to receive said differential current output from said voltage-to-current converter, and having a high-impedance current output formed by the high-impedance current output of an output transistor, said high-impedance current output being connected to said output node to provide a load current;
wherein said transconductance amplifier further includes:
a source that provides a constant quiescent current; and
a positive-feedback circuit having an output that generates an auxiliary current proportional to said load current, said auxiliary current being supplied together with said constant quiescent current to said current feed point of said voltage-to-current converter.

10. A transconductance amplifier as defined in claim 9, wherein:
said positive-feedback circuit has an input, said input being part of said output current mirror;
said output current mirror includes a coupling transistor having a common gate-drain terminal, said common gate-drain terminal being said input of said output current mirror, said output current mirror having a second output; and
said output of the positive-feedback circuit is formed by a current mirror having an output coupled to said current feed point and having an input fed from said second output of the output current mirror.

11. A transconductance amplifier as defined in claim 10, wherein:

said voltage-to-current converter includes first and second n-channel transistors and third and fourth p-channel transistors, said first and second transistors operating in a differential mode, said first and second transistors having a common source terminal that forms said current feed point;

said first transistor has a drain terminal connected to a common gate-drain terminal of said third transistor and to a gate terminal of said fourth transistor, the fourth transistor having a drain terminal connected to a drain terminal of said second transistor to form said first junction point, with said third and fourth transistors forming the active load; and said output current mirror is a p-channel current mirror comprising said coupling transistor, said output transistor and a first positive-feedback transistor, said positive-feedback transistor forming the input to said positive-feedback circuit, said output current mirror having a low end connected to a source of positive supply voltage, said output current mirror having a common gate interconnection line connected to said common gate-drain terminal of said coupling transistor.

12. A transconductance amplifier as defined in claim 11, wherein:

said positive-feedback circuit comprises an n-channel current mirror having an input and an output, said n-channel current mirror comprising second and third positive feedback n-channel transistors;

said first positive-feedback transistor has a drain terminal that feeds said input of said n-channel current mirror; and said drain terminal of said third positive-feedback transistor is connected to said current feed point.

13. A transconductance amplifier as defined in claim wherein at least the first and second transistors of said voltage-to-current converter, the output transistor in said output current mirror, and said first positive-feedback transistor are dimensioned so that their source-drain breakdown voltages are not exceeded by operation at an unregulated supply voltage.

14. A transconductance amplifier as defined in claim 9, further including a current-limiting circuit that limits the load current to a maximum value.

* * * * *